June 3, 1958 J. T. LAW ET AL 2,837,471

METHOD OF LOCATING PN JUNCTIONS IN SEMICONDUCTIVE BODIES

Filed Dec. 30, 1955 2 Sheets-Sheet 1

INVENTORS J. T. LAW
P. S. MEIGS

BY [signature]

ATTORNEY

INVENTORS J. T. LAW
P. S. MEIGS
BY [signature]
ATTORNEY

United States Patent Office 2,837,471

Patented June 3, 1958

2,837,471

METHOD OF LOCATING PN JUNCTIONS IN SEMICONDUCTIVE BODIES

John T. Law, Berkeley Heights, and Peter S. Meigs, Summit, N. J., assignors to Bell Telephone Laboratories, Incorporated, New York, N. Y., a corporation of New York Application December 30, 1955, Serial No. 556,516

3 Claims. (Cl. 204—35)

This invention relates to methods for distinguishing the electrical conductivity type of surface regions in semiconductive bodies, and more particularly to methods for locating and marking p-n junctions thereon.

Many of the newer electronic devices in use today depend for their operation on the utilization of semiconductive bodies having regions of opposite conductivity type therein. Semiconductive bodies are formed from highly purified material, for example, germanium and silicon. In the manufacture of many forms of semiconductive devices, it is the practice to introduce small quantities of desired conductivity type determining impurities into regions of the semiconductive body to form p-n junctions at an early stage of the process of manufacture and at a subsequent stage to provide electrodes to different regions of the body. However, the position of a p-n junction in a semiconductive body is not determinable from inspection of the body. Nevertheless, it is necessary to locate accurately the positions of p-n junctions to determine where electrodes should be applied.

Hitherto, the location of p-n junctions has been accomplished by several methods: the use of voltage probes, the selective staining of p-regions using an appropriate staining solution, the deposition of a layer of a metal on the p-type zones adjacent the p-n junctions, the application of a suspension of dielectric particles on a reversely biased p-n junction whereby the particles arrange in a pattern depending on the resistivity gradient of the region, and the selective etching of one conductivity zone in an etchant bath under appropriate conditions.

None of the above prior art methods is completely satisfactory in all respects for the purpose of defining p-n junctions. In particular, it is desirable to have a method that is rapid and produces marking on the p-n junction that is permanent when undisturbed, and yet easily removable when removal is desired. It is further advantageous that the method employ no toxic solvents and work well on untreated cut surfaces of germanium and silicon crystals. Some of the prior art methods have one or more of the desirable characteristics discussed above, but none incorporates all satisfactorily.

The present invention relates to a method of locating and marking p-n junctions in a semiconductive body by selective staining of the p-type zone. In particular, the process involves the use of a colored dye capable of cathodic reduction in solution as a staining agent on a semiconductive body across which is being applied a potential difference. A solution of the dye is applied to the surface of a semiconductive body containing at least one reversely biased p-n junction therein. Decolorization takes place on the p conductivity type region adjacent the p-n junction and extends across the p-region with time. The bias is then removed, the unreduced dye remaining on the body is removed, and the colorless form of the dye on the p-region is oxidized to the colored dye, resulting in delineation of the p-n junction.

A common dye capable of cathodic reduction particularly advantageous for use in the practice of the applicants' invention is methylene blue, a heterocyclic compound having the structure 3,9-bisdimethylaminophenazothionium chloride, and an important representative of the thiazine dyes. Typically, methylene blue can be reduced by the use of a suitable reducing agent to a colorless form as shown below:

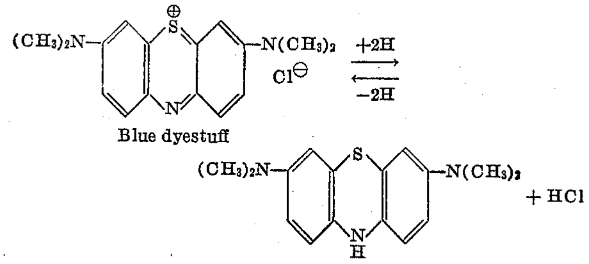

Blue dyestuff

Colorless leuco base

It is understood, of course, that the structure shown for the blue dyestuff is only one of the three possible resonance forms that can be drawn therefor. The reduction to the colorless leuco base is easily reversed to produce the blue dyestuff by employing a suitable oxidizing agent.

In this connection, one feature of the applicants' invention is the use of the oxidation-reduction equilibrium of methylene blue to produce a delineation of p-n junctions in semiconductive bodies.

The applicants' methods have noteworthy advantages over other methods employed in that the method is rapid and produces a delineation of p-n junctions that is clear, permanent if undisturbed, and yet rather easily removed to a large extent by scrubbing with water. Moreover, no toxic solvents are employed. Furthermore, the methods are carried out at room temperature and work well on cut crystals of germanium or silicon without preliminary etching.

The invention will be better understood from the following more detailed description taken with the accompanying drawings in which.

Figure 1:
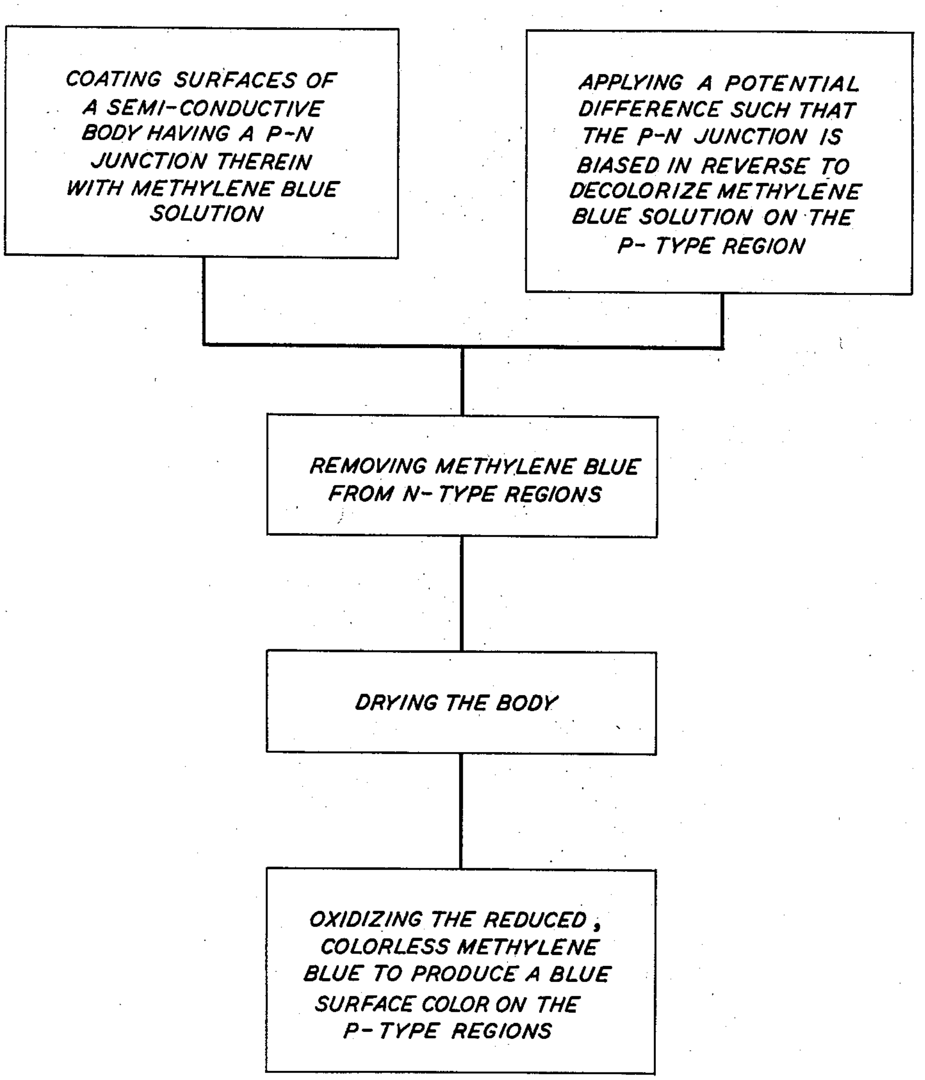
Fig. 1 illustrates diagrammatically the process of the invention.

The process of the invention illustrated in Fig. 1 is intended primarily for use with semiconductive bodies having one p-n junction therein. In one typical example of the use of this process, a saturated aqueous solution of methylene blue dye was brushed over a silicon crystal which was 2 millimeters by 2 millimeters in cross-section and 3 centimeters in length, and known to contain two contiguous regions of opposite conductivity type; the n-region having a resistivity of about 2 ohm centimeters, and the p-region having a resistivity of about 0.2 ohm centimeter. Probes between which existed a potential difference were placed at opposite ends of the crystal. When the p-n junction in the body was biased in reverse by the applied potentials, a sharp white line appeared at the p-n junction, which slowly spread across the p-type region with time. In instances where it is not known which of the two ends of the body is of p-type, it may be necessary to reverse the polarity of the probes to insure that the junction is biased in the reverse direction. No decolorization is observed when the junction is biased in the forward direction. A potential bias of about ten volts at a current of about twenty milliamperes applied for about one minute was sufficient to produce decolorization of the dye on substantially all of the p-type region in the application being described.

The crystal was then lightly washed with water, which removed the unreduced dye from the n-type region while leaving most of the leuco form of the dye on the p-type region. The crystal was next dried and allowed to stand at room temperature in an air ambient to effect oxidation on the p-type region of the colorless leuco form to the blue dye. This process was also carried out successfully on germanium crystals in identical fashion.

It is possible to modify the basic process described without departing from the scope and spirit of the invention. In particular, by adjusting the bias voltage, the bias current, and the biasing time, a fine white line may be formed on the p-side of the junction without decolorization of the entire p-region. The rest of the method is similar to that discussed above with respect to the preferred embodiment.

Figure 2A:
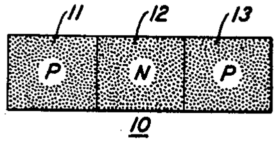
Figs. 2A through 2D show a semiconductive body of p-n-p conductivity type at successive stages of the process.
Figure 2B:
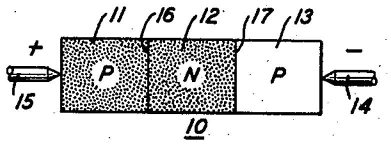
Figure 2C:
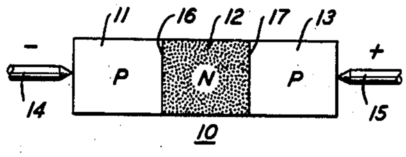
Figure 2D:
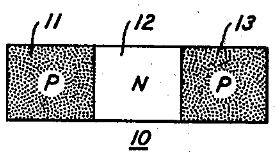

Figs. 2A through 2D show a p-n-p type semiconductive body at successive stages of the process of the invention applied to such a body. In the drawing, surface portions of the body which have been colored blue are shown dotted, while the dotting is omitted on surface portions which are white and colorless. A semiconductive body 10 known to have two p-type regions 11 and 13 and an intermediate n-type region 12 is coated on the surfaces with a saturated aqueous methylene blue solution. At this stage, the entire surface of the body will be dyed blue, as shown in Fig. 2A. Then voltage probes 14 and 15 are applied to the ends of the body, and a suitable potential bias, typically about ten volts, established between the probes. With the negative probe 14 contacting the p-type zone 13 and the positive probe 15 contacting the zone 11, the p-n junction 16 is biased in the forward direction and p-n junction 17 is biased in reverse. This results in the appearance of a fine white line on the p-region 13 adjacent reversely biased p-n junction 17, which spreads across region 13 with time, and results in substantially all the surface of p-type region 13 becoming colorless as shown in Fig. 2B. Thereafter the voltage probes are reversed so that now p-n junction 16 is biased in reverse and p-n junction 17 is biased in the forward direction. A fine white line now appears on p-region 11 adjacent p-n junction 16 which spreads across region 11 with time, and with time substantially all the surface of the p-region becomes colorless, as shown by Fig. 2C. Thereafter the voltage probes are removed and the body washed lightly with water to remove the unreduced dye from the n-region 12. The body is then dried and allowed to stand in air at room temperature until the leuco form of the dye oxidizes to the blue form on the p-regions 11 and 13. The body appears now as shown in Fig. 2D with the p-type regions clearly marked. The color intensity is greatest on the p-region adjacent the junction and fades somewhat toward the outer ends of p-regions 11 and 13.

Figure 3A:
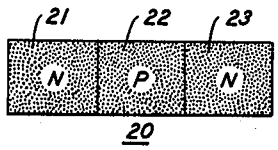
Figs. 3A through 3D show similarly an n-p-n conductivity type semiconductive body in successive stages of the process.
Figure 3B:
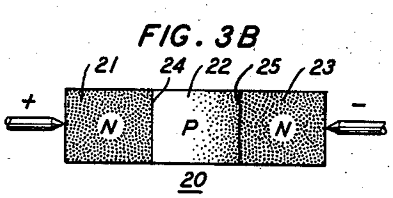
Figure 3C:
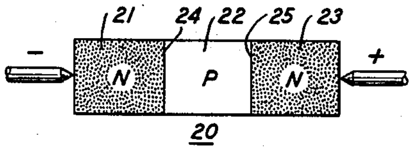
Figure 3D:
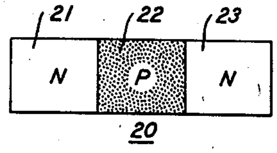

A semiconductive body of n-p-n type in successive stages of the process is shown in Figs. 3A through 3D. An n-p-n type semiconductive body 20 is coated on the surfaces with a saturated aqueous solution of methylene blue to provide a blue coating, as shown in Fig. 3A. A procedure similar to that described above for p-n-p types is followed. With the voltage probes applied as shown in Fig. 3B, the decolorization of the p-region 22 adjacent reversely biased p-n junction 24 is allowed to continue until a broad white band appears as shown. Then the probes are reversed and the decolorization of the p-region adjacent reversely biased p-n junction 25 allowed to proceed until the advancing decolorization meets the colorless band previously obtained, resulting in a colorless surface on p-region 22, as shown in Fig. 3C. The body is then lightly washed with water and the colorless leuco form on the p-region air-oxidized to give a blue region as shown in Fig. 3D.

It is understood that with both the p-n-p and n-p-n type bodies discussed above, the action need not be continued until the p-regions are completely colorless. The decolorization can be allowed to proceed only long enough to result in lines adjacent the p-n junctions. This procedure will equally well mark the p-regions.

An illustrative procedure for defining p-regions in semiconductive bodies having a multiplicity of adjacent regions of opposite conductivity type is shown for a p-n-p-n type structure in Figs. 4A through 4D. In particular, a semiconductive body 30 containing two p-type regions 31 and 33, and two n-type regions 32 and 34, is coated with a saturated aqueous solution of methylene blue to provide the body shown in Fig. 4A.

Figure 4A:
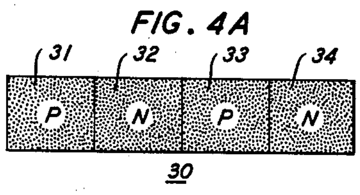
Figs. 4A through 4D show the stages of processing of a p-n-p-n type body.
Figure 4B:
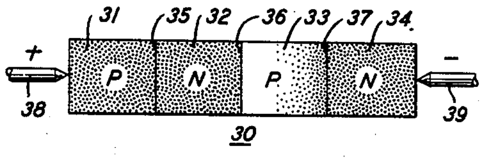
Figure 4C:
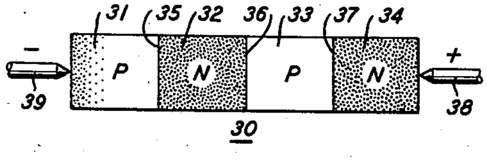
Figure 4D:
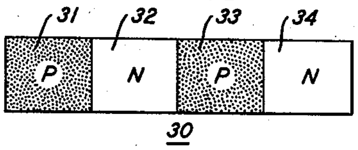

Voltage probes 38 and 39 are then placed on the ends of the body. The polarities may be chosen arbitrarily. As shown in Fig. 4B, probe 38 is biased positively, and probe 39 biased negatively. This arrangement results in p-n junctions 35 and 37 being biased in the forward direction, and p-n junction 36 being biased in reverse. A white line appears on the p-region 33 adjacent junction 36. The probes are reversed after the white line spreads across p-region 33 to become a colorless band. Reversing the voltage probes, as shown in Fig. 4C, results in junctions 35 and 37 being biased in reverse and junction 36 being biased in the forward direction. Now decolorization proceeds across p-region 31 from junction 35 and across p-region 33 from junction 37. After p-region 33 is substantially colorless, the voltage probes are removed, the body washed lightly with water, and air oxidation allowed to take place. The resultant body 40 shown in Fig. 4D has the p-n junctions and the p-regions clearly marked.

Generally, for silicon material of the kind most useful for device applications, the voltage employed is advantageously in the range approximately between six and sixty volts. Higher voltages tend to produce electrolysis of the dye solution and lower voltages take a relatively long time to effect decolorization. The biasing time is advantageously adjusted experimentally to find an optimum time for the particular voltage and current used. Typically, five seconds will bring out white lines on the p-type regions adjacent the p–n junctions, and one minute is usually enough to decolorize the entire p-type regions sufficiently in bodies of the size of the usual interest.

While the oxidation step to produce a blue color on the p-type regions is most easily produced by exposing the appropriate surfaces to air, other methods of oxidizing the colorless leuco form of the dye by employing oxidizing agents can be used without departing from the scope of the invention.

The resulting blue lines and regions are stable in the presence of air. When delineation of the p-regions is no longer desired, the crystal is scrubbed with water to remove substantially all the dye.

It is to be understood that the specific embodiments disclosed are merely illustrative of the general principles of the invention. Various modifications may be devised by one skilled in the art without departing from the spirit and scope of the invention. In particular, while the methylene blue solution used is preferably saturated, more dilute solutions may also be employed. Additionally, although the solutions of methylene blue employed are preferably aqueous, other suitable solvents may be used. It also makes little difference whether the methylene blue solution is applied to the surface of the semiconductive body before biasing, or the solution is applied while the junctions are already biased. Moreover, although the invention has been discussed specifically with reference to silicon, the invention is also applicable to germanium, silicon-germanium alloys, and group III–group V intermetallic semiconductive compounds such as indium antimonide.

What is claimed is:

1. A method of locating and marking a p–n junction in a semiconductive body comprising the steps of coating the surface of said body with a solution comprising a dye, said dye characterized in that it may be cathodically and reversibly reduced in said solution to produce a reduced form which adheres to the surface of said body and which is insoluble in said solution, electrically biasing said junction in the reverse direction for a period of time sufficient to cause selective reduction of the dye in contact with the surface of the p-type portion of said body, removing the unreduced dye from the surface by washing, and oxidizing the reduced form of the dye on said p-type portion back to the colored state.

2. A method in accordance with claim 1 wherein the solution of the colored dye is an aqueous solution of methylene blue.

3. A method in accordance with claim 2 wherein the semiconductive body is silicon, the electrical potential applied as bias is within the range of six to sixty volts and the time the potential is applied is in the range of five seconds to one minute.

References Cited in the file of this patent

UNITED STATES PATENTS

| | | |
|---|---|---|
| 2,694,040 | Davis et al. | Nov. 9, 1954 |
| 2,734,027 | Nickerson et al. | Feb. 7, 1956 |